United States Patent
Kobayashi et al.

[11] Patent Number: 5,182,853
[45] Date of Patent: Feb. 2, 1993

[54] METHOD FOR ENCAPSULTING IC CHIP

[75] Inventors: Yasushi Kobayashi, Kamikodanaka; Seiji Kogure, Nakahara, both of Japan

[73] Assignee: Fujitsu Limited, Kawasaki, Japan

[21] Appl. No.: 786,088

[22] Filed: Oct. 31, 1991

[30] Foreign Application Priority Data

Nov. 6, 1990 [JP] Japan .................. 2-300148

[51] Int. Cl.$^5$ .............................................. H05K 3/30
[52] U.S. Cl. ................................. 29/841; 264/272.11; 264/571; 437/211
[58] Field of Search .............. 29/841, 855, 530; 264/272.11, 571; 174/52.4; 437/211, 212

[56] References Cited

U.S. PATENT DOCUMENTS

| 4,812,420 | 3/1989 | Matsuda et al. ......... | 264/272.11 |
| 4,843,036 | 6/1989 | Schmidt et al. .......... | 29/841 |
| 4,928,376 | 5/1990 | Poglitsch ................ | 29/530 |

FOREIGN PATENT DOCUMENTS

| 577 | 5/1979 | Japan . | |
| 1443333 | 8/1984 | Japan ................. | 437/211 |

*Primary Examiner*—P. W. Echols

[57] ABSTRACT

A resin encapsulating structure includes a substrate having a first region and a second region which surrounds the first region, first pads provided on the substrate in an outer periphery of the second region, an integrated circuit chip which is mounted on the substrate within the first region, second pads provided on the integrated circuit chip, interconnections formed across the first and second pads above the second region, and a resin which is formed on the substrate and covers the integrated circuit chip and the interconnections. The substrate includes one or a plurality of holes which penetrate the substrate and are located within the second region, and the holes provide an escape path for air cells which are generated in the resin particularly when the resin flows between the interconnections.

11 Claims, 6 Drawing Sheets

METHOD FOR ENCAPSULTING IC CHIP

BACKGROUND OF THE INVENTION

The present invention generally relates to methods and structures for encapsulating an integrated circuit (IC) chip, and more particularly to a method and a structure for encapsulating an IC chip which is directly mounted on a substrate using a synthetic resin.

The chip on board (COB) mounting method is an effective method of reducing the size of equipments and improving the performance of the equipments. This COB method is carried out as shown in FIG. 1.

In FIG. 1, an IC chip 12 is bonded and mounted on a substrate 10 using an adhesive agent 11 in a die bonding step 1. Then, the adhesive agent 11 is hardened in a step 2. Wire bonding is made to form wires 13 across pads 14 on the IC chip 12 and pads 15 on the substrate 10 in a wire bonding step 3.

Next, a dispenser 16 is used to supply a resin 17 such as an epoxy resin on the IC chip 12 in a resin encapsulating step 4. The resin 17 covers the entire IC chip 12 and the wires 13. Thereafter, a heating process is carried out to harden the resin 17 in a resin hardening step 5. As a result, a module 18 is completed.

In order to make the quality of the module 18 high, it is important that no air cells remain in the encapsulating resin 17.

FIG. 2 shows an example of a conventional resin encapsulating structure for a mounted IC chip. In FIG. 2, an IC chip 21 is bonded and mounted on a substrate 20 using an adhesive agent 22. Wires 23 are wire-bonded across pads 24 on the IC chip 21 and pads 25 on the substrate 20. An epoxy resin 26 covers the IC chip 21 and the wires 23 to encapsulate the IC chip 21 and the wires 23.

The epoxy rein 26 used has a viscosity of approximately 50 to 100 Poise (P) so that the epoxy resin 26 has an appropriate mountain shape when the epoxy resin 26 encapsulates the IC chip 21 and the wires 23. Otherwise, the epoxy resin 26 will spread and the mountain shape will be too flat to provide an adequate encapsulation.

Recently, the number of the wires 23 is becoming large and the pitch with which the wires 23 are provided is also becoming smaller due to the increased integration density of the IC chip 21. As a result, it is becoming more difficult for the epoxy resin 26 to flow under the wires 23, and air cells are easily generated when the epoxy resin 26 flows under the wires 23 taking in the air.

FIG. 2 shows the case where air cells 27 remain within the epoxy resin 26. In this case, when the structure is heated during the resin hardening step, the air cells 27 expand as indicated by reference numerals 28 in FIG. 3 and cause a swell 29 in the epoxy resin 26. In extreme cases, this swell 29 generates a pin hole 30 in the epoxy resin 26 as shown in FIG. 4. If the swell 29 or the pin hole 30 are generated in the epoxy resin 26, the encapsulating effect of the epoxy resin 26 is lost. In other words, the resistance of the resin encapsulating structure against moisture becomes poor and may cause a corrosion within the IC chip 21 and the wires 23.

In order to eliminate the air cells 27, it is conceivable to additionally provide a vacuum air cell removing step after the resin encapsulating step 4 in FIG. 1. However, the viscosity of the epoxy resin 26 is approximately 50 to 100 P which is relatively high as described above. For this reason, the air cells 27 cannot be removed satisfactorily by the vacuum air cell removing step, and the air cells 27 will still remain to a certain extent and cause the problems described above.

SUMMARY OF THE INVENTION

Accordingly, it is a general object of the present invention to provide a novel and useful method and structure for encapsulating an IC chip, in which the problems described above are eliminated.

Another and more specific object of the present invention is to provide a resin encapsulating structure comprising a substrate having a first region and a second region which surrounds the first region, first pads provided on the substrate in an outer periphery of the second region, an integrated circuit chip which is mounted on the substrate within the first region, second pads provided on the integrated circuit chip, interconnections formed across the first and second pads above the second region, and a resin which is formed on the substrate and covers the integrated circuit chip and the interconnections, where the substrate includes one or a plurality of holes which penetrate the substrate and are located within the second region. According to the resin encapsulating structure of the present invention, it is possible to improve the resistance against moisture when compared to the conventional resin encapsulating structures, because it is possible to present or remove air cells which are generated in the resin.

Still another object of the present invention is to provide a resin encapsulating method for encapsulating an integrated circuit chip which is mounted on a substrate using a resin, comprising the steps of (a) forming a substrate structure which is made up of a substrate, first pads formed on the substrate, an integrated circuit chip mounted on the substrate, second pads formed on the integrated circuit chip, and interconnections formed across the first and second pads, where the substrate has one or a plurality of holes which penetrate the substrate and are located below the interconnections, (b) supplying a predetermined quantity of a resin on the substrate structure so that the resin covers the integrated circuit chip and the interconnections and the resin flows between the interconnections to reach the holes below the interconnections, and (c) drawing the resin under vacuum suction via the holes, so as to provide an escape path for air cells which are generated within the resin as the resin flows between the interconnections in the step (b). According to the resin encapsulating method of the present invention, it is possible to improve the yield of equipments which are produced by the COB method because it is possible to positively remove air cells which are generated within the resin.

Other objects and further features of the present invention will be apparent from the following detailed description when read in conjunction with the accompanying drawings.

DESCRIPTION OF THE PREFERRED EMBODIMENTS

Figure 2:
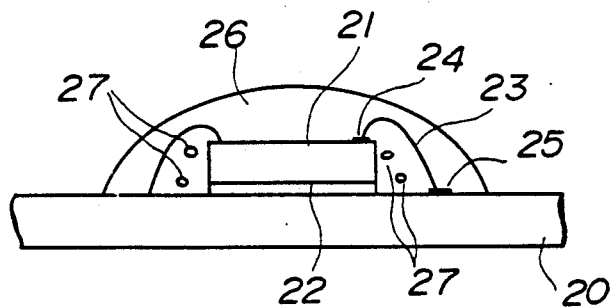
FIG. 2 is a cross sectional view showing an example of a conventional resin encapsulating structure.
Figure 3:
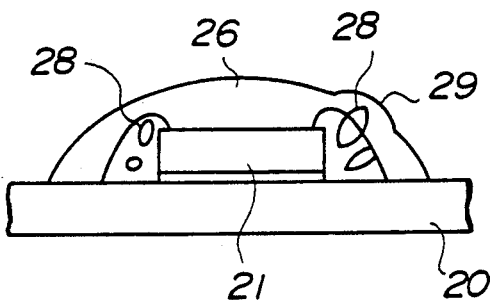
FIG. 3 is a cross sectional view for explaining a generation of a swell in an epoxy resin.
Figure 4:
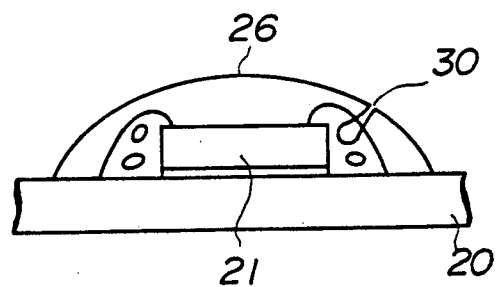
FIG. 4 is a cross sectional view for explaining a generation of a pin hole in the epoxy resin.
Figure 5:
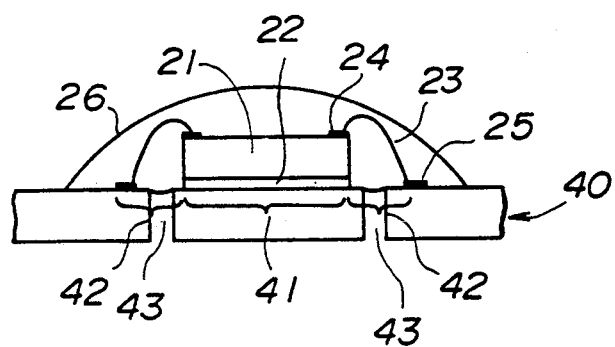
FIG. 5 is a cross sectional view, taken along a line V—V in FIG. 6, showing a first embodiment of a resin encapsulating structure according to the present invention.
Figure 6:
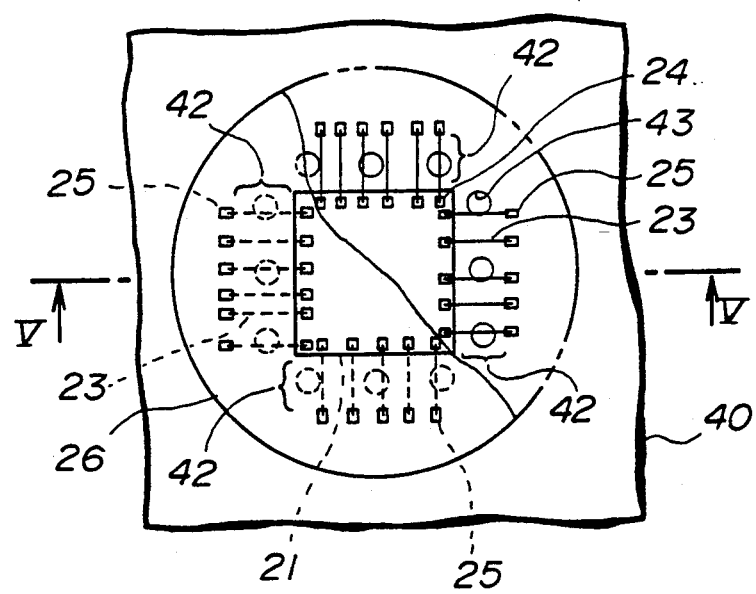
FIG. 6 is a plan view showing the first embodiment.

First, a description will be given of a first embodiment of a resin encapsulating structure according to the present invention, by referring to FIGS. 5 and 6. FIG. 6 shows a plan view of the first embodiment, and FIG. 5 shows a cross sectional view of the first embodiment taken along a line V—V in FIG. 6. In FIGS. 5 and 6, those parts which are the same as those corresponding parts in FIG. 2 are designated by the same reference numerals, and a description thereof will be omitted.

In FIGS. 5 and 6, a substrate 40 has a mounting region 41 where an IC chip 21 is mounted, and a region 42 which is formed between pads 25 on the substrate 40 and pads 24 on the IC chip 21. Wires 23 are wire-bonded across the pads 24 and 25. A plurality of fine circular holes 43 which penetrate the substrate 40 are formed in the region 42 to surround the mounting region 41. The holes 43 have a diameter of approximately 0.1 to 0.5 mm.

The holes 43 have the function of letting out the air cells in the epoxy resin 26, as will be described later. For this reason, no air cells are formed within the encapsulating epoxy resin 26.

Figure 1:
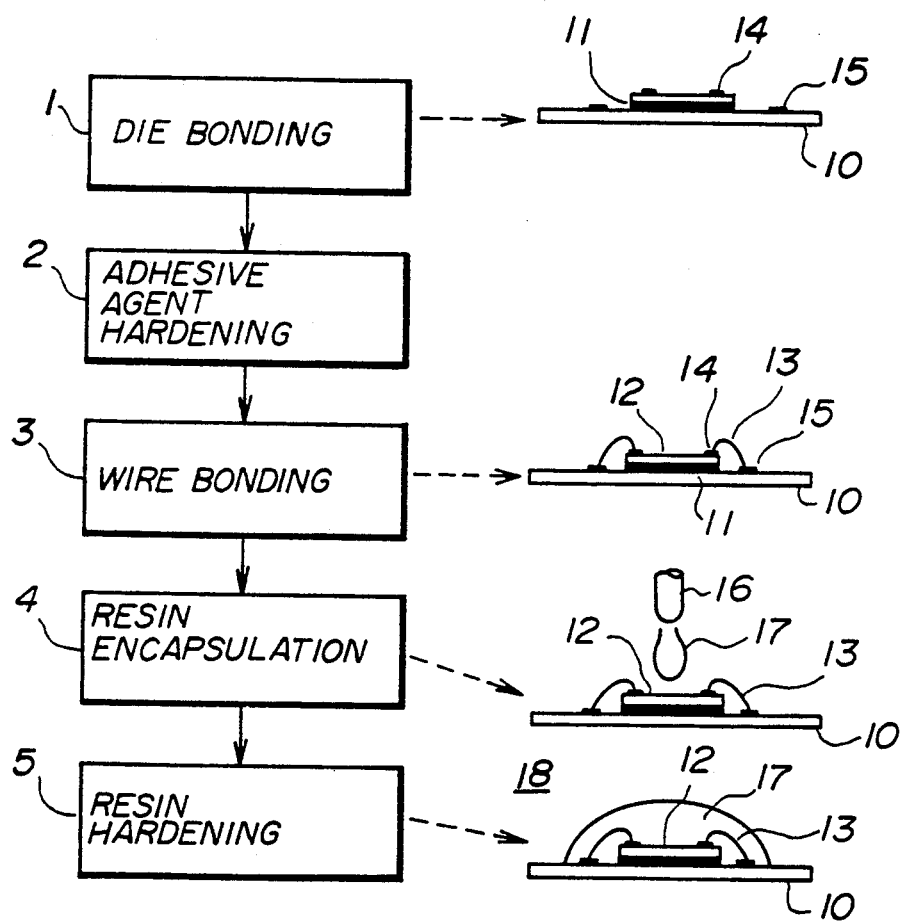
FIG. 1 is a diagram for explaining a COB method.

Next, a description will be given of embodiments of a resin encapsulating method according to the present invention. According to the resin encapsulating method of the present invention, the resin encapsulating step 4 shown in FIG. 1 is replaced by a process which will be described in conjunction with FIGS. 7A through 7D or FIGS. 8A through 8D. In FIGS. 7A through 7D and FIGS. 8A through 8D, those parts which are the same as those corresponding parts in FIGS. 5 and 6 are designated by the same reference numerals, and a description thereof will be omitted.

A first embodiment of the resin encapsulating method according to the present invention will now be described with reference to FIGS. 7A through 7D.

Figure 7A:
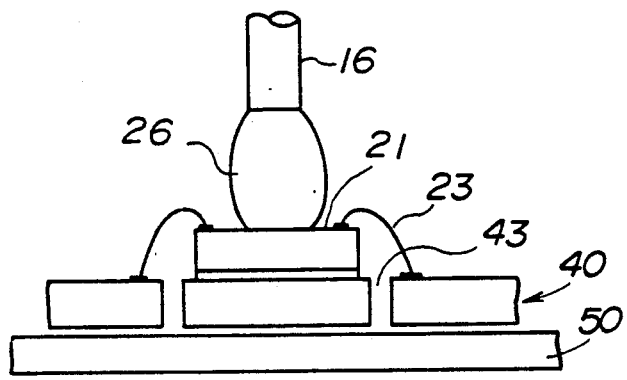
FIGS. 7A through 7D respectively are cross sectional views for explaining a first embodiment of a resin encapsulating method according to the present invention.

First, as shown in FIG. 7A, the substrate 40 which is mounted with the IC chip 21 and the wires 23 wire-bonded is placed on a heater plate 50, similarly as in the case of the conventional COB method described above in conjunction with FIG. 1. In this state, a predetermined quantity of the epoxy resin 26 is supplied from the dispenser 16 onto the IC chip 21.

Figure 7B:
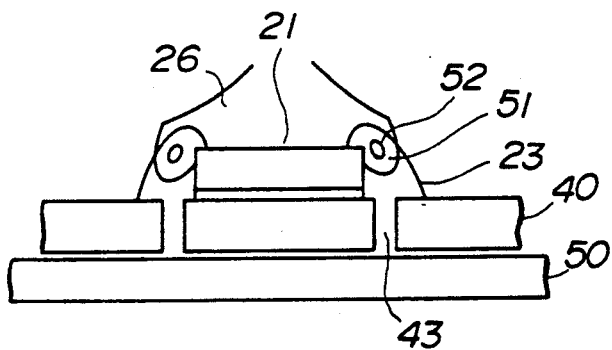

As shown in FIG. 7B, the epoxy resin 26 flows to cover the IC chip 21, and the epoxy resin 26 flows between the adjacent wires 23 to reach below the wires 23. When a downstream tip 51 of the epoxy resin 26 along the flowing direction flows between the adjacent wires 23 and reaches below the wires 23, the flow of the epoxy resin 26 is disturbed and air is trapped within the epoxy resin 26. As a result, air cells 52 are generated within the epoxy resin 26.

Figure 7C:
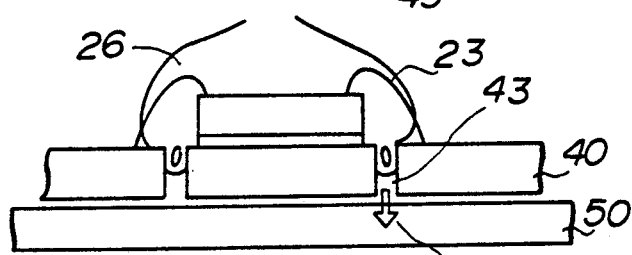

The downstream tip 51 which includes the air cell 52 reaches the substrate 40 first when the flow rate and the viscosity of the epoxy resin 26 are appropriately selected. As a result, the downstream tip 51 enters within the hole 43 in the substrate 40 as shown in FIG. 7C, and the downstream tip 51 continues to flow further down as indicated by an arrow 53 and provides a path for the air cell 52 to escape.

Figure 7D:
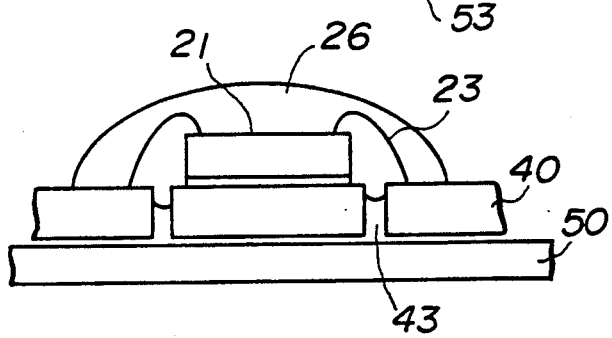

Therefore, the air cells 52 are completely eliminated from within the epoxy resin 26 which covers the IC chip 21 and the wires 23, as shown in FIG. 7D. When the resin encapsulating structure shown in FIG. 7D is heated during the resin hardening step, no swelling of the epoxy resin 26 occurs and no pin hole is formed in the epoxy resin 26 because the epoxy resin 26 which covers the IC chip 21 and the wires 23 is free of air cells. For this reason, the completed resin encapsulating structure has a high resistance against moisture, as shown in FIGS. 5 and 6 described above.

Next, a second embodiment of the resin encapsulating method according to the present invention will now be described with reference to FIGS. 8A through 8D.

Figure 8A:
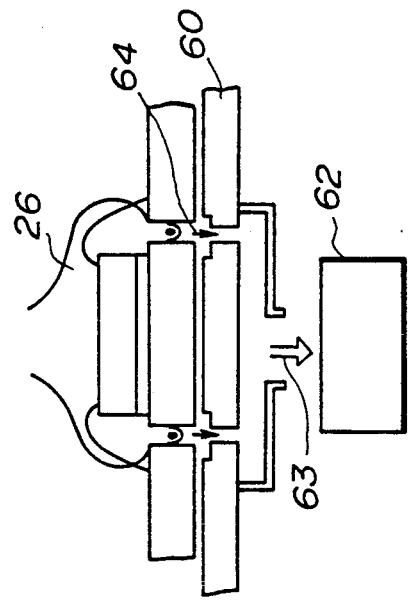
FIGS. 8A through 8D respectively are cross sectional views for explaining a second embodiment of the resin encapsulating method according to the present invention.

As shown in FIG. 8A, the heater plate 60 used in this embodiment has penetration holes 61 which penetrate the heater plate 60. In addition, a vacuum suction unit 62 is provided so that the resin encapsulation is carried out under vacuum of the vacuum suction unit 62 from below the heater plate 60.

Figure 8D:
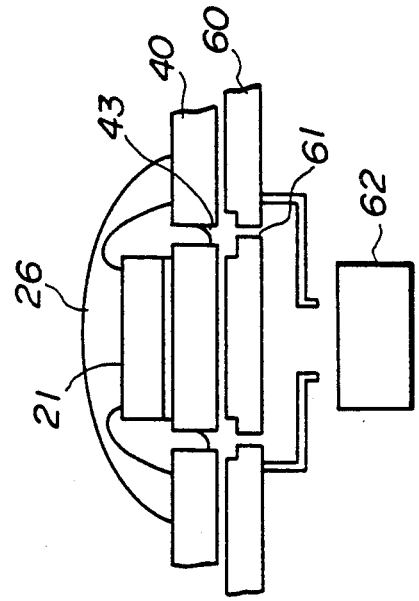
Figure 8B:
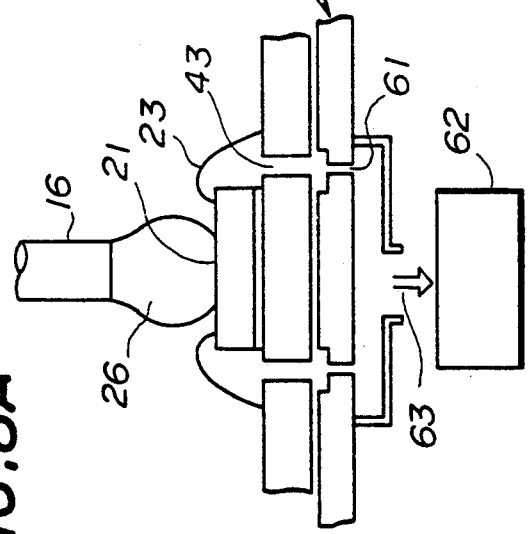

When the epoxy resin 26 flows between the adjacent wires 23 and reaches below the wires 23, the flow of the epoxy resin 26 is disturbed and air is trapped within the epoxy resin 26 as shown in FIG. 8B. As a result, the air cell 52 is generated within the epoxy resin 26 at the downstream tip 51.

Figure 8C:
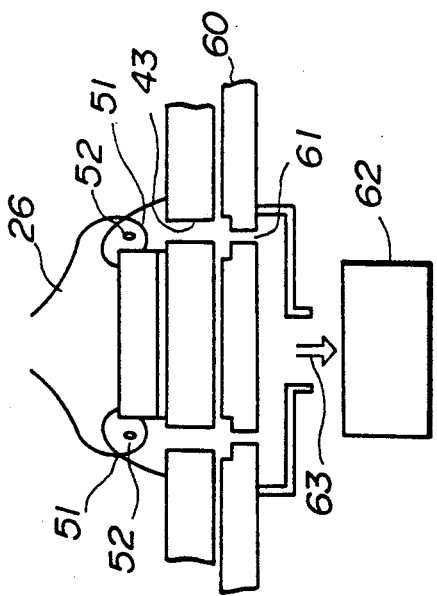

As described above, the downstream tip 51 which includes the air cell 52 reaches the substrate 40 first, and as shown in FIG. 8C, the vacuum suction unit 62 quickly draws the downstream tip 51 into the penetration hole 32 by a suction force indicated by an arrow 63. The air cell 52 within the downstream tip 51 is eliminated by the suction of the vacuum suction unit 62 as indicated by an arrow 64.

Therefore, as shown in FIG. 8D, no air cell remains within the epoxy resin 26 which covers the IC chip 21 and the wires 23. When the resin encapsulating structure shown in FIG. 8D is heated during the resin hardening step, no swelling of the epoxy resin 26 occurs and no pin hole is formed in the epoxy resin 26 because the epoxy resin 26 which covers the IC chip 21 and the wires 23 is free of air cells. For this reason, the completed resin encapsulating structure has a high resistance against moisture, as shown in FIGS. 5 and 6 described above.

Figure 9:
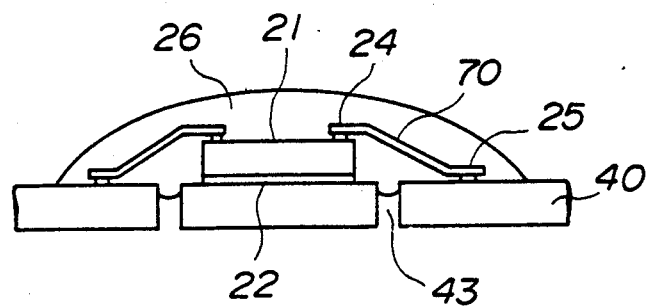
FIG. 9 is a cross sectional view showing a second embodiment of the resin encapsulating structure according to the present invention.

Next, a description will be given of a second embodiment of the resin encapsulating structure according to the present invention, by referring to FIG. 9. In FIG. 9, those parts which are the same as those corresponding parts in FIGS. 5 and 6 are designated by the same reference numerals, and a description thereof will be omitted. In this embodiment, the present invention is applied to the tape carrier system.

In FIG. 9, leads 70 are bonded across the pads 24 on the IC chip 21 and the pads 25 on the substrate 40. Air cells are generated when the epoxy resin 26 flows between the adjacent leads 70 and reaches below the leads 70. However, the air cells can be removed via the holes 43 which are formed in the substrate 40, similarly as in the case of the first embodiment of the resin encapsulating structure. Therefore, the epoxy resin 26 which covers the IC chip 21 and the leads 70 is free of air cells, and the resin encapsulating structure has a high resistance against moisture.

Figure 10:
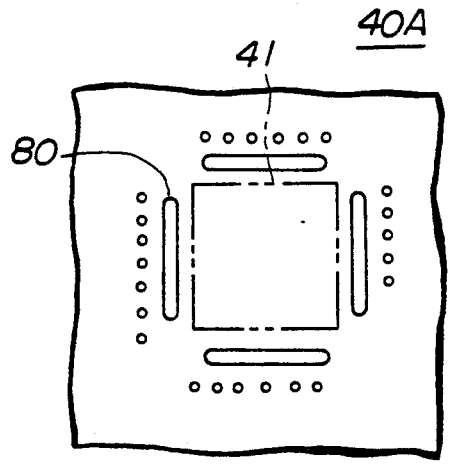
FIG. 10 is a plan view showing an essential part of a third embodiment of the resin encapsulating structure according to the present invention.

FIG. 10 shows an essential part of a third embodiment of the resin encapsulating structure according to the present invention, namely, a plan view of a substrate 40A.

In this third embodiment, the substrate 40A has elongated holes 80.

Figure 11:
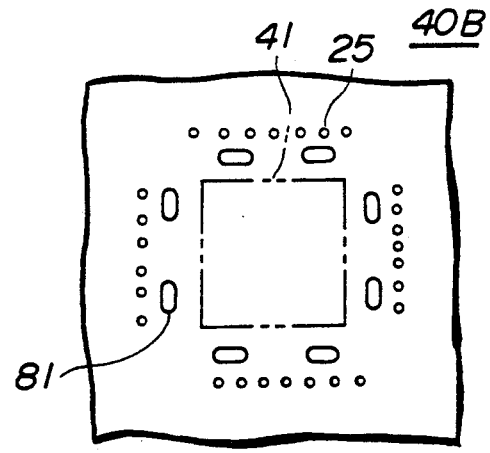
FIG. 11 is a plan view showing an essential part of a fourth embodiment of the resin encapsulating structure according to the present invention.

FIG. 11 shows an essential part of a fourth embodiment of the resin encapsulating structure according to the present invention, namely, a plan view of a substrate 40B.

In this fourth embodiment, the substrate 40B has oval holes 81.

In the third and fourth embodiments, the holes 80 and 81 also enable the removal of the air cells from the epoxy resin 26, and the effect of removing the air cells is particularly satisfactory in the case where the elongated holes 80 are formed in the substrate 40A and the vacuum suction unit 62 is used.

In each of the embodiments described above, the substrate 40 may be made of a material such as a glass epoxy and ceramics. On the other hand, the epoxy resin 26 which covers the IC 21 and the wires 23 or the leads 70 may be made of a material other than epoxy resin, such as silicon resin. The adhesion between the resin 26 and the substrate 40 is particularly satisfactory when epoxy resin is used for the resin 26 and glass epoxy is used for the substrate 40.

Further, the present invention is not limited to these embodiments, but various variations and modifications may be made without departing from the scope of the present invention.

What is claimed is:

1. A resin encapsulating method for encapsulating an integrated circuit chip which is mounted on a substrate using a resin, said resin encapsulating method comprising the steps of:
    (a) forming a substrate structure which is made up of a substrate, first pads formed on the substrate, an integrated circuit chip mounted on the substrate, second pads formed on the integrated circuit chip, and interconnections formed across the first and second pads, said substrate having one or a plurality of holes which penetrate the substrate and are located below the interconnections;
    (b) supplying a predetermined quantity of a resin on the substrate structure so that the resin covers the integrated circuit chip and the interconnections and the resin flows between the interconnections to reach the holes below the interconnections; and
    (c) drawing the resin under vacuum suction via the holes, so as to provide an escape path for air cells which are generated within the resin as the resin flows between the interconnections in said step (b).

2. The resin encapsulating method as claimed in claim 1, wherein said step (a) forms the interconnections from wires which are wire-bonded across the first and second pads.

3. The resin encapsulating method as claimed in claim 1, wherein said step (a) forms the interconnections from leads which are bonded across the first and second pads according to a tape carrier system.

4. The resin encapsulating method as claimed in claim 1, wherein said step (a) uses an integrated circuit chip which has a generally rectangular shape and a substrate which has the holes arranged in line along each side of the generally rectangular integrated chip.

5. The resin encapsulating method as claimed in claim 1, wherein said step (a) uses a substrate having holes which have a shape selected from a group consisting of circular and oval shapes.

6. The resin encapsulating method as claimed in claim 1, wherein said step (a) uses an integrated circuit chip which has a generally rectangular shape and a substrate which has the holes having an elongated shape, and each of the elongated holes is arranged along one side of the generally rectangular integrated chip.

7. The resin encapsulating method as claimed in claim 1, wherein the resin at least partially fills the holes in said step (b).

8. The resin encapsulating method as claimed in claim 1, wherein said step (a) uses a substrate which is made of a material selected from a group consisting of glass epoxy and ceramics.

9. The resin encapsulating method as claimed in claim 1, wherein said step (b) uses a resin which is made of a material selected from a group consisting of epoxy resin and silicon resin.

10. The resin encapsulating method as claimed in claim 1, wherein said step (b) uses a resin which has a viscosity of approximately 50 to 100 Poise.

11. The resin encapsulating method as claimed in claim 1, which further comprises the step (d) of hardening the resin by a heating process.

* * * * *

UNITED STATES PATENT AND TRADEMARK OFFICE
CERTIFICATE OF CORRECTION

PATENT NO.  : 5,182,853
DATED       : February 2, 1993
INVENTOR(S) : Kobayashi, et al.

It is certified that error appears in the above-identified patent and that said Letters Patent is hereby corrected as shown below:

```
On the Title page, inventor should read as following:
item
[75]    Inventors:   Yasushi Kobayashi, Kawasaki;
                     Seiji Kogure, Kawasaki, both of
                     Japan
```

Signed and Sealed this

Thirtieth Day of November, 1993

Attest:

BRUCE LEHMAN

*Attesting Officer*    *Commissioner of Patents and Trademarks*